(12) United States Patent
Chang et al.

(10) Patent No.: US 8,962,360 B2
(45) Date of Patent: Feb. 24, 2015

(54) ORGANIC LAYER DEPOSITION APPARATUS AND METHOD OF MANUFACTURING ORGANIC LIGHT-EMITTING DISPLAY DEVICE BY USING THE ORGANIC LAYER DEPOSITION APPARATUS

(71) Applicant: Samsung Display Co., Ltd., Yongin (KR)

(72) Inventors: Yun-Ho Chang, Yongin (KR); Jong-Won Hong, Yongin (KR); Sang-Su Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/032,152

(22) Filed: Sep. 19, 2013

(65) Prior Publication Data

US 2014/0370633 A1    Dec. 18, 2014

(30) Foreign Application Priority Data

Jun. 17, 2013 (KR) .................. 10-2013-0069188

(51) Int. Cl.
*H01L 21/00*    (2006.01)
*H01L 51/56*    (2006.01)

(52) U.S. Cl.
CPC ...................................... *H01L 51/56* (2013.01)
USPC ............... 438/28; 257/E21.529; 257/E21.525

(58) Field of Classification Search
CPC .... H01L 51/001; H01L 51/0011; H01L 51/56
USPC ................... 438/28; 118/731, 729, 676, 686; 257/E21.529, E21.525; 349/47; 427/74
See application file for complete search history.

(56) References Cited

U.S. PATENT DOCUMENTS 6,274,198 B1    8/2001  Dautartas
6,371,451 B1    4/2002  Choi (Continued)

FOREIGN PATENT DOCUMENTS

EP    1 413 644 A2    4/2004
EP    1 418 250 A2    5/2004

(Continued)

OTHER PUBLICATIONS

Machine English Translation of JP 2001-052862, 20 pages.

(Continued)

*Primary Examiner* — Caridad Everhart
(74) *Attorney, Agent, or Firm* — Christie, Parker & Hale, LLP

(57) ABSTRACT

An organic layer deposition apparatus includes: a conveyer unit including a transfer unit, a first conveyer unit, and a second conveyer unit; a loading unit for fixing a substrate to the transfer unit; a deposition unit including a chamber and at least one organic layer deposition assembly; and a measuring unit located between the loading unit and the deposition unit to measure position information of the substrate before an organic layer is deposited onto the substrate; and an unloading unit for separating, from the transfer unit, the substrate onto which the deposition has been completed, wherein the transfer unit is configured to cyclically move between the first conveyer unit and the second conveyer unit, and wherein the substrate fixed to the transfer unit is configured to be spaced apart from the at least one organic layer deposition assembly while being transferred by the first conveyer unit.

8 Claims, 10 Drawing Sheets

(56) References Cited

U.S. PATENT DOCUMENTS

| | | |
|---|---|---|
| 6,579,422 B1 | 6/2003 | Kakinuma |
| 6,749,906 B2 | 6/2004 | Van Slyke |
| 2001/0006827 A1 | 7/2001 | Yamazaki et al. |
| 2001/0026638 A1 | 10/2001 | Sangu et al. |
| 2002/0076847 A1 | 6/2002 | Yamada et al. |
| 2002/0168577 A1 | 11/2002 | Yoon |
| 2003/0101937 A1 | 6/2003 | Van Slyke et al. |
| 2003/0168013 A1 | 9/2003 | Freeman et al. |
| 2003/0221614 A1 | 12/2003 | Kang et al. |
| 2003/0232563 A1 | 12/2003 | Kamiyama et al. |
| 2004/0029028 A1 | 2/2004 | Shimizu |
| 2004/0086639 A1 | 5/2004 | Grantham et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0194702 A1 | 10/2004 | Sasaki et al. |
| 2004/0195530 A1 | 10/2004 | Kwak et al. |
| 2005/0016461 A1 | 1/2005 | Klug et al. |
| 2005/0031836 A1 | 2/2005 | Hirai |
| 2005/0037136 A1 | 2/2005 | Yamamoto |
| 2005/0153472 A1 | 7/2005 | Yotsuya |
| 2005/0166842 A1 | 8/2005 | Sakamoto |
| 2006/0011136 A1 | 1/2006 | Yamazaki et al. |
| 2006/0144325 A1 | 7/2006 | Jung et al. |
| 2006/0174829 A1 | 8/2006 | An et al. |
| 2006/0205101 A1 | 9/2006 | Lee et al. |
| 2006/0283382 A1* | 12/2006 | Yoshikawa et al. ........... 117/200 |
| 2007/0077358 A1 | 4/2007 | Jeong et al. |
| 2007/0178708 A1 | 8/2007 | Ukigaya |
| 2007/0231460 A1 | 10/2007 | Ukigaya |
| 2008/0014825 A1* | 1/2008 | Fukuda et al. .................. 445/46 |
| 2008/0018236 A1 | 1/2008 | Arai et al. |
| 2008/0115729 A1 | 5/2008 | Oda et al. |
| 2008/0131587 A1 | 6/2008 | Boroson et al. |
| 2008/0216741 A1 | 9/2008 | Ling et al. |
| 2009/0017192 A1 | 1/2009 | Matsuura |
| 2009/0229524 A1 | 9/2009 | Kim et al. |
| 2009/0232976 A1 | 9/2009 | Yoon et al. |
| 2010/0297349 A1 | 11/2010 | Lee et al. |
| 2012/0009328 A1 | 1/2012 | Ryu et al. |
| 2012/0103255 A1* | 5/2012 | Fukuda .......................... 118/668 |
| 2012/0145077 A1 | 6/2012 | Chang et al. |

FOREIGN PATENT DOCUMENTS

| | | |
|---|---|---|
| EP | 1 518 940 A1 | 3/2005 |
| JP | 04-272170 A | 9/1992 |
| JP | 08-027568 A | 1/1996 |
| JP | 2000-068054 A | 3/2000 |
| JP | 2001-052862 A | 2/2001 |
| JP | 2001-093667 A | 4/2001 |
| JP | 2002-175878 A | 6/2002 |
| JP | 2003-003250 A | 1/2003 |
| JP | 2003-077662 A | 3/2003 |
| JP | 2003-157973 A | 5/2003 |
| JP | 2003-197531 A | 7/2003 |
| JP | 2003-297562 A | 10/2003 |
| JP | 2004-035964 A | 2/2004 |
| JP | 2004-043898 A | 2/2004 |
| JP | 2004-76150 A | 3/2004 |
| JP | 2004-103269 A | 4/2004 |
| JP | 2004-103341 A | 4/2004 |
| JP | 2004-137583 A | 5/2004 |
| JP | 2004-199919 A | 7/2004 |
| JP | 2005-044592 A | 2/2005 |
| JP | 2005-206939 A | 8/2005 |
| JP | 2005-235568 A | 9/2005 |
| JP | 2005-293968 A | 10/2005 |
| JP | 2005-296737 A | 10/2005 |
| JP | 3705237 B2 | 10/2005 |
| JP | 2006-028583 A | 2/2006 |
| JP | 2006-172930 A | 6/2006 |
| JP | 2006-176809 A | 7/2006 |
| JP | 2006-275433 A | 10/2006 |
| JP | 2006-292955 A | 10/2006 |
| JP | 2007-047293 A | 2/2007 |
| JP | 2007-291506 A | 11/2007 |
| JP | 2008-121098 A | 5/2008 |
| JP | 2009-019243 A | 1/2009 |
| JP | 2009-024208 A | 2/2009 |
| JP | 2009-081165 A | 4/2009 |
| JP | 2009-087910 A | 4/2009 |
| JP | 2010-261081 A | 11/2010 |
| KR | 10-2000-0019254 A | 4/2000 |
| KR | 10-1997-0054303 B1 | 5/2000 |
| KR | 10-2000-0023929 A | 5/2000 |
| KR | 10-2001-0059939 A | 7/2001 |
| KR | 10-2001-0093666 A | 10/2001 |
| KR | 10-2002-0000201 A | 1/2002 |
| KR | 10-2002-0050922 A | 6/2002 |
| KR | 10-2002-0090934 A | 12/2002 |
| KR | 10-2003-0034730 A | 5/2003 |
| KR | 10-0405080 B1 | 11/2003 |
| KR | 10-2003-0091947 A | 12/2003 |
| KR | 10-2003-0093959 A | 12/2003 |
| KR | 10-2004-0014258 A | 2/2004 |
| KR | 10-2004-0034537 A | 4/2004 |
| KR | 2004-0050045 A | 6/2004 |
| KR | 2004-0069281 A | 8/2004 |
| KR | 10-2004-0084747 A | 10/2004 |
| KR | 10-2004-0087142 A | 10/2004 |
| KR | 10-0463212 B1 | 12/2004 |
| KR | 10-0520159 B1 | 10/2005 |
| KR | 10-2006-0008602 A | 1/2006 |
| KR | 10-2006-0018745 A | 3/2006 |
| KR | 10-2006-0073367 A | 6/2006 |
| KR | 10-2006-0080475 A | 7/2006 |
| KR | 10-2006-0080481 A | 7/2006 |
| KR | 10-2006-0080482 A | 7/2006 |
| KR | 10-2006-0083510 A | 7/2006 |
| KR | 10-2006-0104288 A | 10/2006 |
| KR | 10-2006-0104675 A | 10/2006 |
| KR | 10-2006-0104677 A | 10/2006 |
| KR | 10-2006-0109627 A | 10/2006 |
| KR | 10-2006-0114462 A | 11/2006 |
| KR | 10-0646160 B1 | 11/2006 |
| KR | 10-2006-0123944 A | 12/2006 |
| KR | 10-0687007 B1 | 2/2007 |
| KR | 10-2007-0025164 A | 3/2007 |
| KR | 10-0696547 B1 | 3/2007 |
| KR | 10-0696550 B1 | 3/2007 |
| KR | 10-0698033 B1 | 3/2007 |
| KR | 10-0700466 B1 | 3/2007 |
| KR | 10-2007-0035796 A | 4/2007 |
| KR | 10-0711885 B1 | 4/2007 |
| KR | 10-2007-0050793 A | 5/2007 |
| KR | 10-0723627 B1 | 6/2007 |
| KR | 10-0726132 B1 | 6/2007 |
| KR | 10-2007-0078713 A | 8/2007 |
| KR | 10-2007-0080635 A | 8/2007 |
| KR | 10-2007-0101842 A | 10/2007 |
| KR | 10-2007-0105595 A | 10/2007 |
| KR | 10-0770653 B1 | 10/2007 |
| KR | 10-0787457 B1 | 12/2007 |
| KR | 10-2008-0001184 A | 1/2008 |
| KR | 10-2008-0003720 A | 1/2008 |
| KR | 10-0797787 B1 | 1/2008 |
| KR | 10-0800125 B1 | 1/2008 |
| KR | 10-0815265 B1 | 3/2008 |
| KR | 10-2008-0036983 A | 4/2008 |
| KR | 10-0823508 B1 | 4/2008 |
| KR | 10-2008-0044775 A | 5/2008 |
| KR | 10-0827760 B1 | 5/2008 |
| KR | 10-0839380 B1 | 6/2008 |
| KR | 10-2008-0060400 A | 7/2008 |
| KR | 10-2008-0061132 A | 7/2008 |
| KR | 10-2008-0061774 A | 7/2008 |
| KR | 10-2008-0062212 A | 7/2008 |
| KR | 10-0889872 B1 | 3/2009 |
| KR | 10-2009-0038733 A | 4/2009 |
| KR | 10-2009-0097453 A | 9/2009 |
| KR | 10-2010-0099806 A | 9/2010 |

(56) References Cited

FOREIGN PATENT DOCUMENTS

| KR | 10-2010-0126125 A | 12/2010 |
|---|---|---|
| KR | 10-2012-0006324 A | 1/2012 |
| KR | 10-2012-0065789 A | 6/2012 |

OTHER PUBLICATIONS

Machine English Translation of JP 2003-003250, 25 pages.
Machine English Translation of JP 2009-024208, 30 pages.
Korean Office action dated Aug. 1, 2011 for corresponding Korean Patent No. 10-2009-0074001, 3 pages.
Korean Office action dated Feb. 1, 2012 for corresponding Korean Patent No. 10-2010-0014272, 4 pages.
Korean Office action dated Feb. 6, 2012 for corresponding Korean Patent No. 10-2010-0021835, 4 pages.
Korean Office action dated Apr. 2, 2012 for corresponding Korean Patent No. 10-2010-0066993, 4 pages.
KIPO Registration Determination Certificate dated Aug. 24, 2012, for Korean Patent application 10-2010-0066993, 5 pages.
Korean Patent Abstracts, Publication No. 10-0257219 B1, dated Feb. 29, 2000, for corresponding Korean Patent No. 10-1997-0054303 B1, 2 pages.
Korean Patent Abstracts, Publication No. 10-2002-0086047 A, dated Nov. 18, 2002, for corresponding Korean Patent No. 10-0405080, 2 pages.
Korean Patent Abstracts, Publication No. 10-2002-0088662 A, dated Nov. 29, 2002, for corresponding Korean Patent No. 10-0463212, 2 pages.
Korean Patent Abstracts, Publication No. 10-2005-0045619 A, dated May 17, 2005, for corresponding Korean Patent No. 10-0520159, 2 pages.
Korean Patent Abstracts, Publication No. 10-2004-0062203 A, dated Jul. 7, 2004, for corresponding Korean Patent No. 10-0646160, 2 pages.
Korean Patent Abstracts, Publication No. 10-2006-0101987 A, dated Sep. 27, 2006, for corresponding Korean Patent No. 10-0687007, 2 pages.
Korean Patent Abstracts, Publication No. 10-2002-0056238 A, dated Jul. 10, 2001, for corresponding Korean Patent No. 10-0698033, 2 pages.
Korean Patent Abstracts, Publication No. 10-2005-0078637 A, dated Aug. 5, 2005, for corresponding Korean Patent No. 10-0700466, 2 pages.
Korean Patent Abstracts, Publication No. 10-2007-0025164 A, dated Mar. 8, 2007, for corresponding Korean Patent No. 10-0711885, 2 pages.
Korean Patent Abstracts, Publication No. 10-2002-0034272 A, dated May 9, 2002, for corresponding Korean Patent No. 10-0726132, 2 pages.
Korean Patent Abstracts, Publication No. 10-2006-0126267 A, dated Dec. 7, 2006, for corresponding Korean Patent No. 10-0797787, 2 pages.
English Abstract, Publication No. 10-2008-0002189 A, dated Jan. 4, 2008, for corresponding Korean Patent No. 10-0800125, 1 page.
Korean Patent Abstracts, Publication No. 10-2007-0050793 A, dated May 16, 2007, for corresponding Korean Patent No. 10-0815265, 2 pages.
Korean Patent Abstracts, Publication No. 10-2001-0062735 A, dated Jul. 7, 2001, for corresponding Korean Patent No. 10-0827760, 2 pages.
Korean Patent Abstracts, Publication No. 10-2008-0038650 A, dated May 7, 2008, for corresponding Korean Patent No. 10-0839380, 2 pages.

\* cited by examiner

ORGANIC LAYER DEPOSITION APPARATUS AND METHOD OF MANUFACTURING ORGANIC LIGHT-EMITTING DISPLAY DEVICE BY USING THE ORGANIC LAYER DEPOSITION APPARATUS

CROSS-REFERENCE TO RELATED APPLICATION

This application claims priority to and the benefit of Korean Patent Application No. 10-2013-0069188, filed on Jun. 17, 2013, in the Korean Intellectual Property Office, the disclosure of which is incorporated herein in its entirety by reference.

BACKGROUND

1. Field

Aspects of embodiments according to the present invention relate to an organic layer deposition apparatus and a method of manufacturing an organic light-emitting display device by using the organic layer deposition apparatus.

2. Description of the Related Art

Organic light-emitting display devices have wider viewing angles, better contrast characteristics, and faster response speeds than other display devices, and thus have drawn attention as a next-generation display device.

An organic light-emitting display device includes intermediate layers (including an emission layer) interposed between a first electrode and a second electrode facing each other. The electrodes and the intermediate layers may be formed using various methods, one of which is an independent deposition method. When an organic light-emitting display device is manufactured by using the deposition method, a fine metal mask (FMM) having the same pattern as that of an organic layer to be formed is positioned to closely contact a substrate on which the organic layer and the like are formed, and an organic layer material is deposited through the FMM to form the organic layer having a desired pattern.

However, the deposition method using such an FMM presents difficulties in manufacturing larger organic light-emitting display devices using a large mother glass. For example, when such a large mask is used, the mask may bend due to its own weight, thereby distorting the pattern. Such disadvantages are not conducive to the recent trend towards high-definition patterns.

Moreover, processes of aligning a substrate and an FMM to closely contact each other, performing deposition thereon, and separating the FMM from the substrate are time-consuming, resulting in a long manufacturing time and low production efficiency.

Information disclosed in this Background section was known to the inventors of the present invention before achieving the present invention or is technical information acquired in the process of achieving the present invention. Therefore, it may contain information that does not form the prior art or information that was not already known in this country to a person of ordinary skill in the art prior to the time the present invention was made by the inventors.

SUMMARY

Embodiments according to the present invention provide an organic layer deposition apparatus which is easily applied in a mass production process for large substrates, wherein a substrate and an organic layer deposition assembly may be precisely aligned in a deposition operation and a method of manufacturing an organic light emitting display device by using the organic layer deposition apparatus.

According to an embodiment of the present invention, an organic layer deposition apparatus is provided. The organic layer deposition apparatus includes: a conveyer unit including a transfer unit for fixing a substrate and configured to move along with the substrate, a first conveyer unit for moving in a first direction the transfer unit, on which the substrate is fixed, and a second conveyer unit for moving in a direction opposite to the first direction the transfer unit from which the substrate is separated after deposition has been completed; a loading unit for fixing the substrate to the transfer unit; a deposition unit including a chamber configured to be maintained in a vacuum state and at least one organic layer deposition assembly for depositing an organic layer onto the substrate fixed to the transfer unit that is transferred from the loading unit; and a measuring unit located between the loading unit and the deposition unit to measure position information of the substrate before the organic layer is deposited onto the substrate; and an unloading unit for separating, from the transfer unit, the substrate onto which the deposition has been completed, wherein the separating is performed while the transfer unit passes through the deposition unit, wherein the transfer unit is configured to cyclically move between the first conveyer unit and the second conveyer unit, and wherein the substrate fixed to the transfer unit is configured to be spaced apart from the at least one organic layer deposition assembly while being transferred by the first conveyer unit.

The position information may include a degree of distortion of the substrate with respect to the first direction and a distance from the measuring unit to the substrate.

The measuring unit may include: a capturing unit for measuring a degree of distortion of the substrate with respect to the first direction; and a gap sensor for measuring a distance of the gap sensor to the substrate.

The substrate may include a layer forming substrate and a master substrate, wherein the master substrate may be fixed to the transfer unit and input into the deposition unit before the layer forming substrate is fixed to the transfer unit and input to the deposition unit.

The measuring unit may be configured to measure a degree of distortion of the master substrate with respect to the first direction and a distance of the measuring unit to the master substrate before measuring a degree of distortion of the layer forming substrate with respect to the first direction and a distance of the measuring unit to the layer forming substrate, and after the master substrate is input into the deposition unit, the measuring unit may be configured to measure a degree of distortion of the layer forming substrate with respect to the first direction and a distance of the measuring unit to the layer forming substrate.

The measuring unit may be configured to compare the degree of distortion of the master substrate with respect to the first direction and the degree of distortion of the layer forming substrate with respect to the first direction to calculate a difference in distortion of the layer forming substrate with respect to the master substrate.

The deposition unit and the layer forming substrate may be aligned with respect to each other according to the difference in distortion of the layer forming substrate.

The measuring unit may be configured to calculate a difference between the distance of the measuring unit to the master substrate and the distance of the measuring unit to the layer forming substrate.

A height of the deposition unit may be controlled so as to maintain a substantially uniform interval between the layer forming substrate and the deposition unit based on the difference between the distance of the measuring unit to the master substrate and the distance of the measuring unit to the layer forming substrate.

The organic layer deposition assembly may include: a deposition source for discharging a deposition material; a deposition source nozzle unit located at a side of the deposition source, wherein at least one deposition nozzle is formed in the deposition source nozzle unit; and a patterning slit sheet facing the deposition source nozzle unit and including a plurality of patterning slits, wherein the substrate may be spaced apart from the organic layer deposition assembly so as to move relative to the organic layer deposition apparatus, and wherein the deposition material discharged from the deposition source may pass through the patterning slit sheet to be deposited onto the substrate in a pattern.

The patterning slit sheet of the organic layer deposition assembly may have a smaller size than the substrate in at least one of the first direction or a second direction.

At least one deposition source nozzle may be formed in the deposition source nozzle unit along the first direction, wherein a plurality of patterning slits may be formed in the patterning slit sheet along a second direction perpendicular to the first direction.

In another embodiment according to the present invention, a method of manufacturing an organic light-emitting display device by using an organic layer deposition apparatus for forming an organic layer on a substrate is provided. The method includes: fixing the substrate to a transfer unit by using a loading unit; transporting, into a chamber, the transfer unit onto which the substrate is fixed, by using a first conveyer unit passing through the chamber; measuring position information of the substrate before the organic layer is formed on the substrate; forming the organic layer by depositing a deposition material discharged from an organic layer deposition assembly, onto the substrate while the substrate is moved relative to the organic layer deposition assembly, wherein the organic layer deposition assembly in the chamber is spaced apart from the substrate; separating the substrate, onto which the forming of the organic layer has been completed, from the transfer unit by using an unloading unit; and transporting the transfer unit, from which the substrate has been separated, to the loading unit by using a second conveyer unit passing through the chamber.

The position information may include a degree of distortion of the substrate with respect to a first direction and a distance of a measuring unit to the substrate.

The substrate may include a layer forming substrate and a master substrate, wherein the master substrate may be input into the chamber before the layer forming substrate is input into the chamber.

In the measuring of the position information, position information of the layer forming substrate may be measured after position information of the master substrate is measured, and the layer forming substrate is fixed to the transfer unit and transferred to the chamber.

The forming the organic layer may include: aligning the organic layer deposition assembly and the layer forming substrate by comparing the position information of the master substrate and the position information of the layer forming substrate; and forming an organic layer by depositing a deposition material discharged from the organic layer deposition assembly, onto the substrate while the organic layer deposition assembly is moved relative to the layer forming substrate based on alignment information about alignment between the organic layer deposition assembly and the layer forming substrate.

The aligning may include: comparing the degree of distortion of the master substrate with respect to the first direction and the degree of distortion of the layer forming substrate with respect to the first direction to calculate a difference in distortion of the layer forming substrate with respect to the master substrate, and calculating a distance of a measuring unit to the master substrate and a distance of the measuring unit to the layer forming substrate; and aligning the organic layer deposition assembly and the layer forming substrate according to the change of distortion of the layer forming substrate, and controlling a height of a deposition unit so as to maintain a substantially uniform interval between the layer forming substrate and the deposition unit according to a difference in the distance of the measuring unit to the master substrate and the distance of the measuring unit to the layer forming substrate.

The organic layer deposition assembly may include: a deposition source for discharging a deposition material; a deposition source nozzle unit located at a side of the deposition source and including a plurality of deposition source nozzles; and a patterning slit sheet facing the deposition source nozzle unit and including a plurality of patterning slits, wherein the deposition material discharged from the deposition source may pass through the patterning slit sheet to be deposited onto the substrate in a pattern.

The patterning slit sheet of the organic layer deposition assembly may have a smaller size than the substrate in at least one of a first direction or a second direction.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
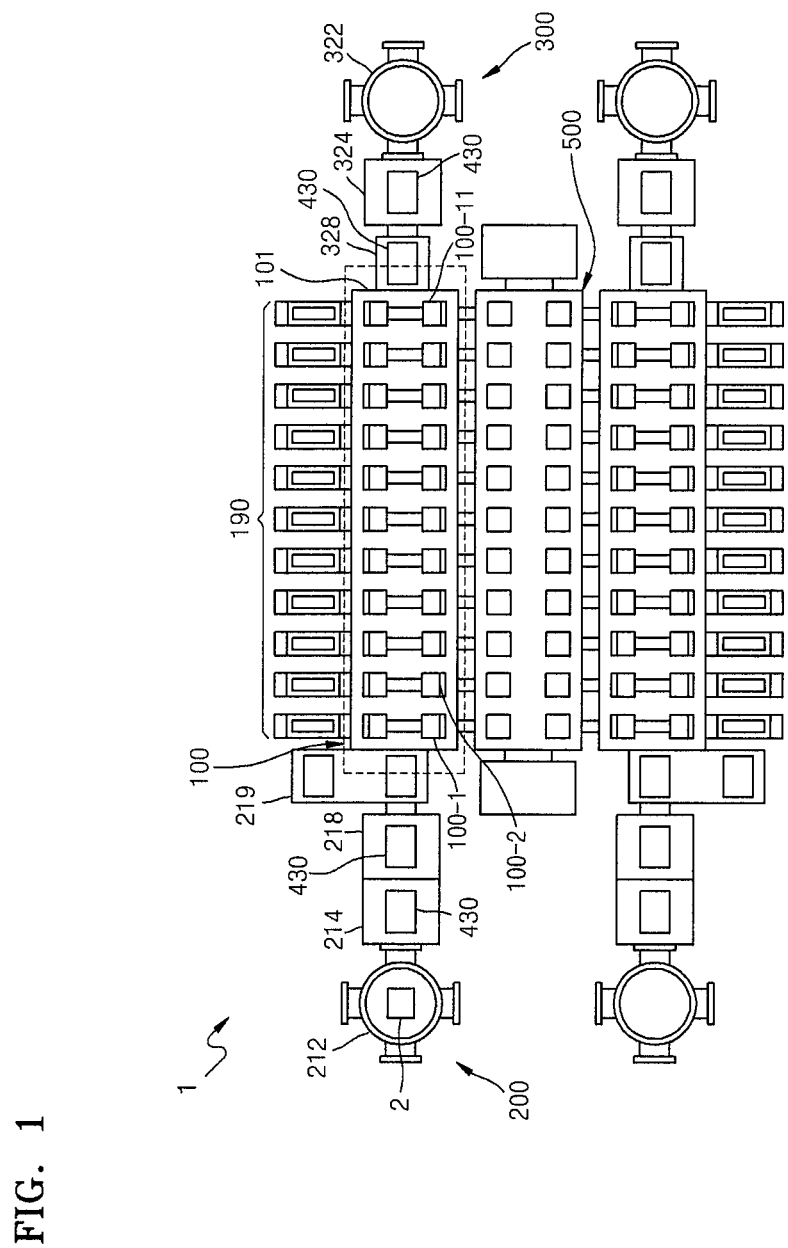
FIG. 1 is a schematic plan view illustrating a structure of an organic layer deposition apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain aspects of the present invention by referring to the figures. Expressions such as "at least one of," when preceding a list of elements, modify the entire list of elements and do not modify the individual elements of the list.

Figure 2:
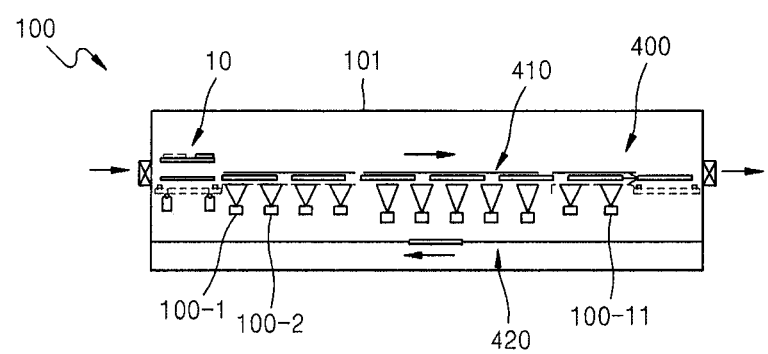
FIG. 2 is a schematic side view of a deposition unit of the organic layer deposition apparatus of FIG. 1 according to an embodiment of the present invention.

FIG. 1 is a schematic plan view illustrating an organic layer deposition apparatus 1 according to an embodiment of the present invention. FIG. 2 is a schematic side view of a deposition unit 100 of the organic layer deposition apparatus 1 of FIG. 1, according to an embodiment of the present invention.

Referring to FIGS. 1 and 2, the organic layer deposition apparatus 1 includes a measuring unit 10, the deposition unit 100, a loading unit 200, an unloading unit 300, and a conveyer unit 400.

The loading unit 200 may include a first rack 212, a transport chamber 214, a first inversion chamber 218, and a buffer chamber 219.

A plurality of substrates 2 onto which a deposition material has not yet been applied are stacked up on the first rack 212. A transport robot included in the transport chamber 214 picks up one of the substrates 2 from the first rack 212, places it on a transfer unit 430 transferred by a second conveyer unit 420, and moves the transfer unit 430 on which the substrate 2 is placed into the first inversion chamber 218.

The first inversion chamber 218 is located adjacent to the transport chamber 214. The first inversion chamber 218 includes a first inversion robot that inverts the transfer unit 430 and then loads it on a first conveyer unit 410 of the deposition unit 100.

Referring to FIG. 1, the transport robot of the transport chamber 214 places one of the substrates 2 on a top surface of the transfer unit 430, and the transfer unit 430 on which the substrate 2 is placed is then transferred into the first inversion chamber 218. The first inversion robot of the first inversion chamber 218 inverts the transfer unit 430 so that the substrate 2 is turned upside down in the deposition unit 100.

The unloading unit 300 is configured to operate in an opposite manner to the loading unit 200 described above. Specifically, a second inversion robot in a second inversion chamber 328 inverts the transfer unit 430, which has passed through the deposition unit 100 while the substrate 2 is placed on the transfer unit 430, and then moves the transfer unit 430 on which the substrate 2 is placed into an ejection chamber 324. Then, an ejection robot takes the transfer unit 430 on which the substrate 2 is placed out of the ejection chamber 324, separates the substrate 2 from the transfer unit 430, and then loads the substrate 2 on a second rack 322. The transfer unit 430, separated from the substrate 2, is returned to the loading unit 200 via the second conveyer unit 420.

However, the present invention is not limited to the above example. For example, when placing the substrate 2 on the transfer unit 430, the substrate 2 may be fixed (or attached) onto a bottom surface of the transfer unit 430 and then moved into the deposition unit 100. In such an embodiment, for example, the first inversion robot of the first inversion chamber 218 and the second inversion robot of the second inversion chamber 328 may be omitted.

The measuring unit 10 may be located between the loading unit 200 and the deposition unit 100 and measure position information of the substrate 2 before the substrate 2 is input into the deposition unit 100. That is, the measuring unit 10 may measure its distance to the substrate 2 and a degree of the substrate 2 distorted with respect to a convey direction (e.g., transport direction) of the transfer unit 430. The substrate 2 and the organic layer deposition assemblies 100-1 through 100-11 are aligned based on the position information of the substrate 2 measured by using the measuring unit 10. This will be further described later.

The deposition unit 100 may include at least one chamber for deposition. In one embodiment, as illustrated in FIGS. 1 and 2, the deposition unit 100 includes a chamber 101 in which a plurality of organic layer deposition assemblies 100-1 through 100-n may be located. Referring to FIG. 1, 11 organic layer deposition assemblies, i.e., a first organic layer deposition assembly 100-1, a second organic layer deposition assembly 100-2, through an eleventh organic layer deposition assembly 100-11, are located in the chamber 101, but the number of organic layer deposition assemblies may vary with a desired deposition material and deposition conditions. The chamber 101 is maintained in vacuum during the deposition process.

In the embodiment illustrated in FIG. 1, the transfer unit 430 with the substrate 2 fixed (or attached) thereon may be moved at least to the deposition unit 100 or may be moved sequentially to the loading unit 200, the deposition unit 100, and the unloading unit 300, by the first conveyer unit 410, and the transfer unit 430 that is separated from the substrate 2 in the unloading unit 300 may be moved back to the loading unit 200 by the second conveyer unit 420.

The first conveyer unit 410 passes through the chamber 101 when passing through the deposition unit 100, and the second conveyer unit 420 conveys (or transports) the transfer unit 430 from which the substrate 2 is separated.

In the present embodiment, the organic layer deposition apparatus 1 is configured such that the first conveyer unit 410 and the second conveyer unit 420 are respectively located above and below so that after the transfer unit 430, on which deposition has been completed while passing through the first conveyer unit 410, is separated from the substrate 2 in the unloading unit 300, the transfer unit 430 is returned to the loading unit 200 via the second conveyer unit 420 formed below the first conveyer unit 410, whereby the organic layer deposition apparatus 1 may have an improved space utilization efficiency.

In an embodiment, the deposition unit 100 of FIG. 1 may further include a deposition source replacement unit 190 located at a side of each organic layer deposition assembly. Although not particularly illustrated in the drawings, the deposition source replacement unit 190 may be formed as a cassette-type that may be drawn to the outside from each organic layer deposition assembly. Thus, a deposition source 110 (refer to FIG. 3) of the organic layer deposition assembly 100-1 may be easily replaced.

FIG. 1 illustrates the organic layer deposition apparatus 1 in which two sets of structures each including the loading unit 200, the deposition unit 100, the unloading unit 300, and the conveyer unit 400 are arranged in parallel. That is, it can be seen that two organic layer deposition apparatuses 1 are respectively arranged at one side and another side of the organic deposition apparatus 1 (above and below in FIG. 1).

In such an embodiment, a patterning slit sheet replacement unit 500 may be located between the two organic layer deposition apparatuses 1. That is, due to this configuration of structures, the two organic layer deposition apparatuses 1 share the patterning slit sheet replacement unit 500, resulting in improved space utilization efficiency, as compared to a case where each organic layer deposition apparatus 1 includes the patterning slit sheet replacement unit 500.

Figure 3:
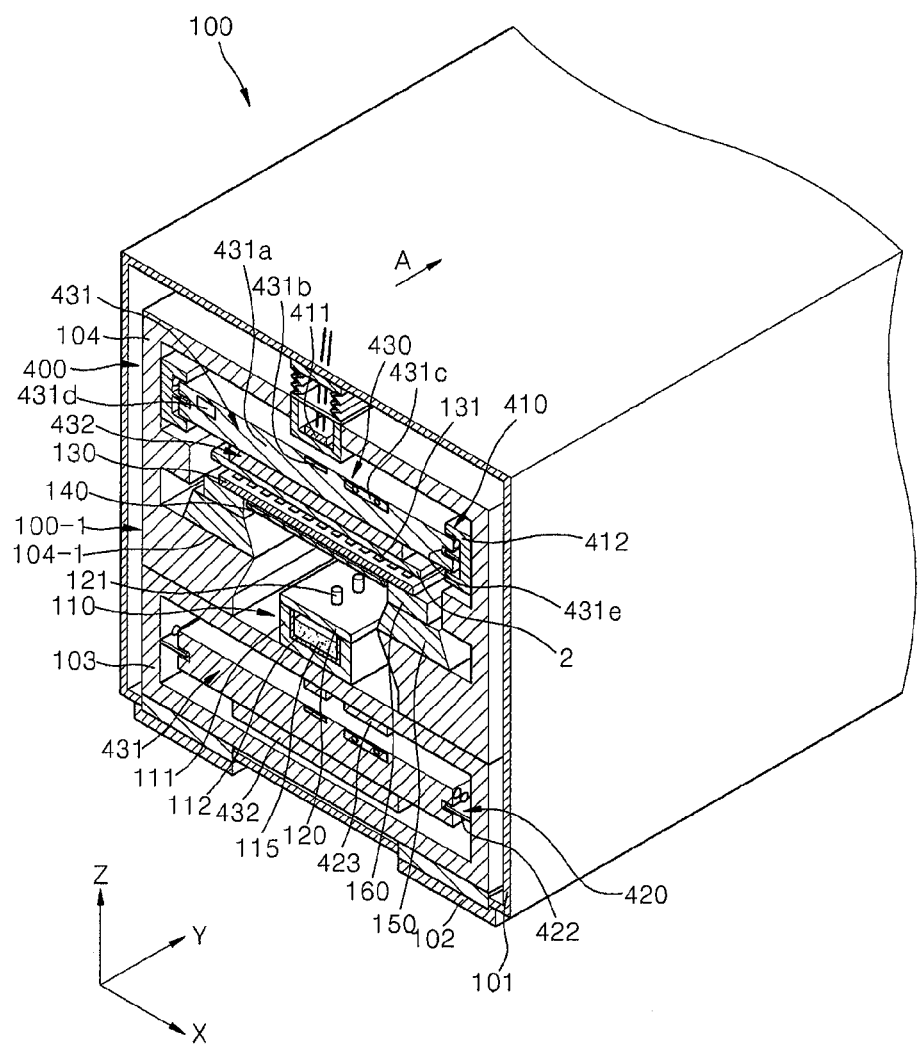
FIG. 3 is a schematic perspective view of the deposition unit of the organic layer deposition apparatus of FIG. 1 according to an embodiment of the present invention.
Figure 4:
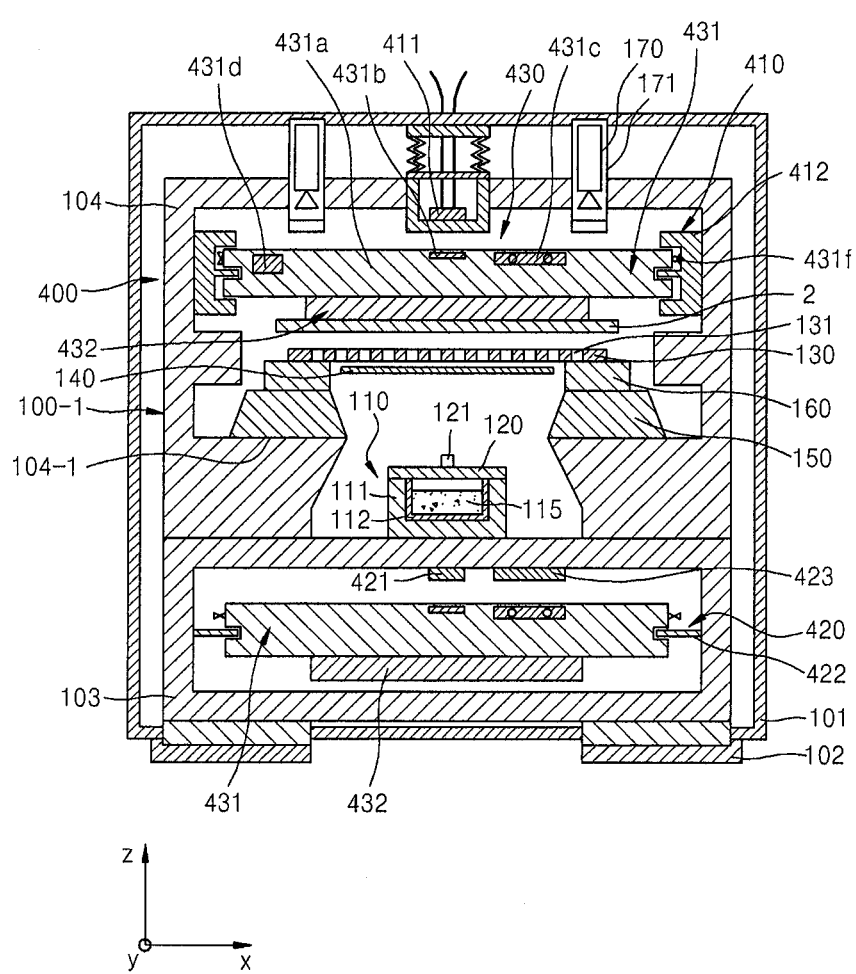
FIG. 4 is a schematic cross-sectional view of the deposition unit of FIG. 3, according to an embodiment of the present invention.

FIG. 3 is a schematic perspective view of the deposition unit 100 of the organic layer deposition apparatus 1 of FIG. 1 according to an embodiment of the present invention. FIG. 4 is a schematic cross-sectional view of the deposition unit 100 of FIG. 3 according to an embodiment of the present invention.

Referring to FIGS. 3 and 4, the deposition unit 100 of the organic layer deposition apparatus 1 includes at least one organic layer deposition assembly 100-1 and a conveyer unit 400.

Hereinafter, an overall structure of the deposition unit 100 will be described.

The chamber 101 may be formed as a hollow box type and accommodate the at least one organic layer deposition assembly 100-1 and the transfer unit 430. In another descriptive manner, a foot 102 is formed so as to fix the deposition unit 100 on the ground, a lower housing 103 is located on the foot 102, and an upper housing 104 is located on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are located on the foot 102 fixed on the ground, the lower housing 103 and the upper housing 104 may be maintained in a fixed position even though the chamber 101 is repeatedly contracted and expanded. Thus, the lower housing 103 and the upper housing 104 may serve as a reference frame in the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. While the transfer unit 430 is cyclically moving between the first conveyer unit 410 and the second conveyer unit 420, a deposition process is continuously performed.

Hereinafter, constituents of the organic layer deposition assembly 100-1 are described in detail.

The first organic layer deposition assembly 100-1 includes the deposition source 110, a deposition source nozzle unit 120, a patterning slit sheet 130, a shielding member 140, a first stage 150, and a second stage 160. In this regard, all the elements illustrated in FIGS. 3 and 4 may be arranged in the chamber 101 maintained in an appropriate vacuum state. This structure is used to achieve the linearity of a deposition material.

For example, in order to deposit a deposition material 115 that has been discharged from the deposition source 110 and passed through the deposition source nozzle unit 120 and the patterning slit sheet 130, onto the substrate 2 in a desired pattern, it is desirable to maintain the chamber (not shown) in the same vacuum state as that used in a deposition method using a fine metal mask (FMM). In addition, the temperature of the patterning slit sheet 130 should be sufficiently lower than that of the deposition source 110 because thermal expansion of the patterning slit sheet 130 is reduced or minimized when the temperature of the patterning slit sheet 130 is sufficiently low.

The substrate 2 on which the deposition material 115 is to be deposited is arranged in the chamber 101. The substrate 2 may be a substrate for a flat panel display device. For example, a large substrate of 40 inches or larger, such as a mother glass, for manufacturing a plurality of flat panel displays, may be used as the substrate 2.

According to the present embodiment, the deposition process may be performed with the substrate 2 being moved relative to the organic layer deposition assembly 100-1.

In a conventional deposition method using an FMM, the size of the FMM is the same as that of a substrate. Thus, as the size of the substrate increases, the size of the FMM also increases. Due to these problems, it is difficult to fabricate the FMM and to align the FMM in a precise pattern by elongation of the FMM.

To address these problems, in the organic layer deposition assembly 100-1 according to the present embodiment, deposition may be performed while the organic layer deposition assembly 100-1 and the substrate 2 are moved relative to each other. In other words, deposition may be continuously performed while the substrate 2, which faces the organic layer deposition assembly 100-1, is moved in a Y-axis direction. That is, deposition is performed in a scanning manner while the substrate 2 is moved in a direction of arrow A illustrated in FIG. 3. Although the substrate 2 is illustrated as being moved in the Y-axis direction in the chamber 101 in FIG. 3 when deposition is performed, the present invention is not limited thereto. For example, deposition may be performed while the organic layer deposition assembly 100-1 is moved in the Y-axis direction and the substrate 2 is held in a fixed position.

Thus, in the organic layer deposition assembly 100-1, the patterning slit sheet 130 may be smaller (e.g., much smaller) than an FMM used in a conventional deposition method. In other words, in the organic layer deposition assembly 100-1, deposition is continuously performed, i.e., in a scanning manner while the substrate 2 is moved in the Y-axis direction. Thus, at least one of the lengths of the patterning slit sheet 130 in X-axis and Y-axis directions may be much less than a length of the substrate 2. Because the patterning slit sheet 130 may be formed smaller (e.g., much smaller) than the FMM used in a conventional deposition method, it is relatively easy to manufacture the patterning slit sheet 130. That is, the small patterning slit sheet 130 is more suitable in view of the manufacturing processes, including etching followed by precise elongation, welding, transferring, and washing processes, than the FMM used in a conventional deposition method. In addition, this is more suitable for manufacturing a relatively large display device.

In order to perform deposition while the organic layer deposition assembly 100-1 and the substrate 2 are moved relative to each other as described above, the organic layer deposition assembly 100-1 and the substrate 2 may be spaced apart from each other by a certain distance (e.g., a gap). This is described below in more detail.

The deposition source 110 that contains and heats the deposition material 115 is located at a side opposite to (facing) a side in which the substrate 2 is located in the chamber. As the deposition material 115 contained in the deposition source 110 is vaporized, deposition is performed on the substrate 2.

The deposition source 110 includes a crucible 111 that is filled with the deposition material 115 and a heater 112 that heats the crucible 111 so as to vaporize the deposition material 115 toward a side of the crucible 111 filled with the deposition material 115, in particular, toward the deposition source nozzle unit 120.

The deposition source nozzle unit 120, in one embodiment, is located at a side of the deposition source 110 facing the substrate 2. In this regard, the organic layer deposition assemblies according to the present embodiment each may include different deposition nozzles in performing deposition for forming common layers and pattern layers.

In one embodiment, the patterning slit sheet 130 may be located between the deposition source 110 and the substrate 2. The patterning slit sheet 130 may further include a frame 135 (see for example, FIG. 5) having a shape similar to a window frame. The patterning slit sheet 130 includes a plurality of patterning slits 131 arranged along the X-axis direction. The deposition material 115 that has been vaporized in the deposition source 110 passes through the deposition source nozzle unit 120 and the patterning slit sheet 130 and is then deposited onto the substrate 2. In this regard, the patterning slit sheet 130 may be formed using the same method as that used to form an FMM, in particular, a stripe-type mask, e.g., etching. In this regard, a total number of patterning slits 131 may be more than a total number of deposition source nozzles 121.

In one embodiment, the deposition source 110 (and the deposition source nozzle unit 120 combined thereto) and the patterning slit sheet 130 may be spaced apart from each other by a certain distance (e.g., a gap).

As described above, deposition is performed while the organic layer deposition assembly 100-1 is moved relative to the substrate 2. In order for the organic layer deposition assembly 100-1 to be moved relative to the substrate 2, the patterning slit sheet 130 is spaced apart from the substrate 2 by a certain distance (e.g., a gap).

In a conventional deposition method using an FMM, deposition is typically performed with the FMM in close contact with a substrate in order to prevent formation of shadows on the substrate. However, when the FMM is formed in close contact with the substrate, defects due to the contact between the substrate and the FMM may occur. In addition, because it is difficult to move the mask with respect to the substrate, the mask and the substrate have the same size. Accordingly, the mask becomes larger as the size of a display device increases. However, it is difficult to form a large mask.

To address these problems, in the organic layer deposition assembly 100-1 according to the present embodiment, the patterning slit sheet 130 is formed spaced apart by a certain distance (e.g., a gap) from the substrate 2 on which a deposition material is to be deposited.

According to the present embodiment, deposition may be performed while a mask formed smaller than a substrate is moved with respect to the substrate, and thus, it is relatively easy to manufacture the mask. In addition, defects due to contact between the substrate and the mask may be prevented. In addition, because it is unnecessary to closely contact the substrate with the mask during a deposition process, a manufacturing speed may be improved.

Hereinafter, particular disposition of each element of the upper housing 104 will be described.

The deposition source 110 and the deposition source nozzle unit 120 are located at a bottom portion of the upper housing 104. Accommodation portions 104-1 are respectively formed on both sides of the deposition source 100 and the deposition source nozzle unit 120 to have a protruding shape. The first stage 150, the second stage 160, and the patterning slit sheet 130 are sequentially formed on the accommodation portions 104-1 in this order.

In this regard, the first stage 150 is formed to move in X-axis and Y-axis directions so that the first stage 150 aligns the patterning slit sheet 130 in the X-axis and Y-axis directions. That is, the first stage 150 includes a plurality of actuators so that the first stage 150 is moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is located on the second stage 160. The patterning slit sheet 130 is located on the first stage 150 and the second stage 160 so as to move in the X-axis, Y-axis, and Z-axis directions, and thus, an alignment, in particular, a real-time alignment, between the substrate 2 and the patterning slit sheet 130 may be performed.

In addition, the upper housing 104, the first stage 150, and the second stage 160 may guide a flow path of the deposition material 115 such that the deposition material 115 discharged through the deposition source nozzles 121 is not dispersed outside the flow path. That is, the flow path of the deposition material 115 is sealed by the upper housing 104, the first stage 150, and the second stage 160, and thus, the movement of the deposition material 115 in the X-axis and Y-axis directions may be thereby concurrently or simultaneously guided.

The shielding member 140 may be located between the patterning slit sheet 130 and the deposition source 110. In particular, an anode or cathode pattern is formed on an edge portion of the substrate 2 and is used as a terminal for inspecting a product or in manufacturing a product. If an organic material is applied on this region (i.e., the edge portion on which the anode or cathode pattern is formed) of the substrate 2, the anode or the cathode cannot sufficiently perform its function. Thus, the edge portion of the substrate 2 is formed to be a non-film-forming region on which an organic material or the like is not applied. As described above, however, in the organic layer deposition apparatus, deposition is performed in a scanning manner while the substrate 2 is moved relative to the organic layer deposition apparatus, and thus, it is not easy to prevent the organic material from being deposited on the non-film-forming region of the substrate 2.

Therefore, to prevent the organic material from being deposited on the non-film-forming region of the substrate 2, in the organic layer deposition apparatus, the shielding member 140 may be further located at the edge portion of the substrate 2. Although not particularly illustrated in FIGS. 3 and 4, the shielding member 140 may include two adjacent plates and may be disposed in a direction perpendicular to a movement direction of the substrate 2.

When the substrate 2 does not pass through the organic layer deposition assembly 100-1, the shielding member 140 screens the deposition source 110, and thus, the deposition material 115 discharged from the deposition source 110 does not reach the patterning slit sheet 130. When the substrate 2 enters into the organic layer deposition assembly 100-1 with the shielding member 140 screening the deposition source 110, a front part of the shielding member 140 which screens the deposition source 110 moves along with the movement of the substrate 2, and thus, the flow path of the deposition material 115 is opened and the deposition material 115 discharged from the deposition source 110 passes through the patterning slit sheet 130 and is deposited on the substrate 2. Also, while the substrate 2 is passing through the organic layer deposition assembly 100-1, a rear part of the shielding member 140 moves along with the movement of the substrate 2 to screen the deposition source 110 so that the flow path of the deposition material 115 is closed. Accordingly, the deposition material 115 discharged from the deposition source 110 does not reach the patterning slit sheet 130.

As described above, the non-film-forming region of the substrate 2 is screened by the shielding member 140, and thus, it may be possible or be relatively easy to prevent the organic material from being deposited on the non-film-forming region of the substrate 2 without using a separate structure.

Hereinafter, the conveyer unit 400 that conveys (e.g., transports) the substrate 2, on which the deposition material 115 is to be deposited, is described in more detail. Referring to FIGS. 3 and 4, the conveyer unit 400 includes the first conveyer unit 410, the second conveyer unit 420, and the transfer unit 430.

The first conveyer unit 410 conveys (or transports) in an in-line manner the transfer unit 430, including the carrier 431 and an electrostatic chuck 432 attached thereto, and the substrate 2 attached to the transfer unit 430 so that an organic layer may be formed on the substrate 2 by the organic layer deposition assembly 100-1.

The second conveyer unit 420 returns to the loading unit 200 the transfer unit 430 from which the substrate 2 has been separated in the unloading unit 300 after one deposition cycle is completed while the transfer unit 430 is passing through the deposition unit 100. The second conveyer unit 420 includes a coil 421, roller guides 422, and a charging track 423.

The transfer unit 430 includes the carrier 431 that is conveyed (e.g., transported) along the first conveyer unit 410 and the second conveyer unit 420 and the electrostatic chuck 432 that is combined on (or attached to) a surface of the carrier 431. The substrate 2 is attached to the electrostatic chuck 432.

Hereinafter, each element of the conveyer unit 400 will be described in more detail.

The carrier 431 of the transfer unit 430 will now be described in detail.

The carrier 431 includes a main body part 431a, a linear motion system (LMS) magnet (e.g., magnetic rail) 431b, contactless power supply (CPS) modules 431c, a power supply unit 431d, and guide grooves 431e.

The main body part 431a constitutes a base part of the carrier 431 and may be formed of a magnetic material such as iron. In this regard, due to a magnetic force between the main body part 431a and the respective upper and side magnetically suspended bearings (e.g., magnetic levitation bearings) (not shown), the carrier 431 may be maintained spaced apart from the guide members 412 by a certain distance (e.g., a gap).

The guide grooves 431e may be respectively formed at both sides of the main body part 431a and each may accommodate a guide protrusion (not shown) of the guide member 412.

The LMS magnet (e.g., magnetic rail) 431b may be formed along a center line of the main body part 431a in a direction where the main body part 431a proceeds. The LMS magnet 431b and the coil 411, which are described below in more detail, may be combined with each other to constitute a linear motor, and the carrier 431 may be conveyed (e.g., transported) in an arrow A direction by the linear motor.

The CPS modules 431c and the power supply unit 431d may be respectively formed on both sides of the LMS magnet 431b in the main body part 431a. The power supply unit 431d includes a battery (e.g., a rechargeable battery) that provides power so that the electrostatic chuck 432 can chuck (e.g., fix or hold) the substrate 2 and maintains operation. The CPS modules 431c are wireless charging modules that charge the power supply unit 431d. For example, the charging track 423 formed in the second conveyer unit 420, which is described below, is connected to an inverter (not shown), and thus, when the carrier 431 is transferred into the second conveyer unit 420, a magnetic field is formed between the charging track 423 and the CPS modules 431c so as to supply power to the CPS module 431c. The power supplied to the CPS modules 431c is used to charge the power supply unit 431d.

The electrostatic chuck 432 may include an electrode embedded in a main body formed of ceramic, wherein the electrode is supplied with power. The substrate 2 is attached onto a surface of the main body of the electrostatic chuck 432 as a suitable voltage (e.g., a high voltage or a relatively high voltage) is applied to the electrode.

Hereinafter, an operation of the transfer unit 430 is described in more detail.

The LMS magnet 431b of the main body part 431a and the coil 411 may be combined with each other to constitute an operation unit. In this regard, the operation unit may be a linear motor. The linear motor has a small frictional coefficient, little position error, and a high degree (e.g., a very high degree) of position determination, as compared to a conventional slide guide system. As described above, the linear motor may include the coil 411 and the LMS magnet 431b. The LMS magnet 431b is linearly arranged on the carrier 431, and a plurality of coils 411 may be located at an inner side of the chamber 101 by a certain distance so as to face the LMS magnet 431b. Because the LMS magnet 431b is located at the carrier 431 instead of the coil 411, the carrier 431 may be operable without power being supplied thereto.

In this regard, the coil 411 may be formed in an atmosphere (ATM) box in an air atmosphere and the carrier 431 to which the LMS magnet 431b is attached may be moved in the chamber 101 maintained in vacuum.

The organic layer deposition assembly 100-1 of the organic layer deposition apparatus 1 according to the present embodiment may further include the camera (or cameras) 170 for an aligning process.

The camera (or cameras) 170 may align in real time a first alignment mark M1 (FIG. 6) formed on the patterning slit sheet 130 and a second alignment mark M2 (FIG. 6) formed on the substrate 2. In this regard, the camera (or cameras) 170 is positioned to obtain a more accurate view inside the chamber 101 that is maintained in vacuum during deposition. For this, the camera (or cameras) 170 may be installed in a camera accommodation unit 171 in an atmospheric state.

Meanwhile, the organic layer deposition apparatus 1 according to the current embodiment of the present invention may further include the measuring unit 10 (see FIG. 2) that measures position information of the substrate 2.

The measuring unit 10 may be located between the loading unit 200 and the deposition unit 100 and measure position information of the substrate 2 before the substrate 2 is input into the deposition unit 100. The position information of the substrate 2 refers to a distance from the gap sensor unit 11 to the substrate 2 and a degree of distortion of the substrate 2 with respect to a convey direction (e.g., a transport direction) of the transfer unit 430. This will be further described below with reference to FIG. 5.

Figure 5:
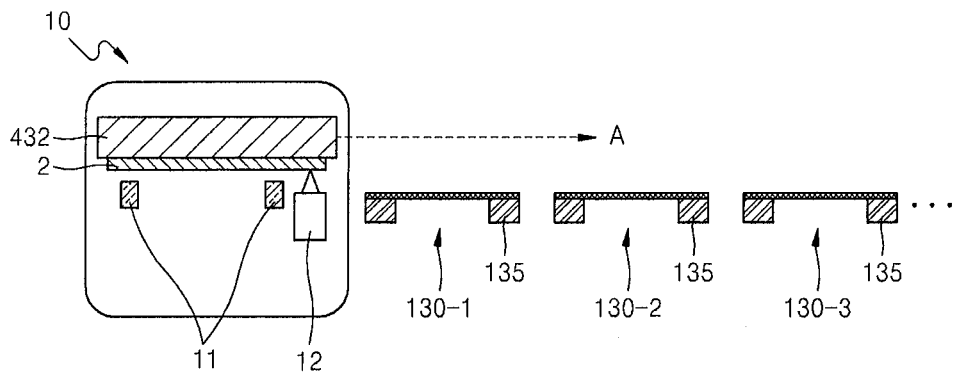
FIG. 5 schematically illustrates a measuring unit and a patterning slit sheet according to an embodiment of the present invention.

FIG. 5 schematically illustrates the measuring unit 10 and the patterning slit sheet 130 (e.g., patterning slit sheets 130-1, 130-2, 130-3, etc.). Referring to FIG. 5, the measuring unit 10 may include a gap sensor unit 11 and a capturing unit 12.

The gap sensor unit 11 is located below the substrate 2 that is placed under the electrostatic chuck 432 and may measure a distance of the gap sensor unit 11 to a lower surface of the substrate 2.

The capturing unit 12 may be located under the substrate 2 that is placed under the electrostatic chuck 432 and may measure a degree of distortion of the substrate 2 with respect to a convey direction (e.g., a transport direction) of the electrostatic chuck 432.

Position information of the substrate 2 measured by using the measuring unit 10 may be used in aligning the substrate 2 and the patterning slit sheets 130-1 through 130-n respectively included in the organic layer deposition assemblies 100-1 through 100-n when the substrate 2 moves along above the patterning slit sheets 130-1 through 130-n of the organic layer deposition assembly.

Figure 6:
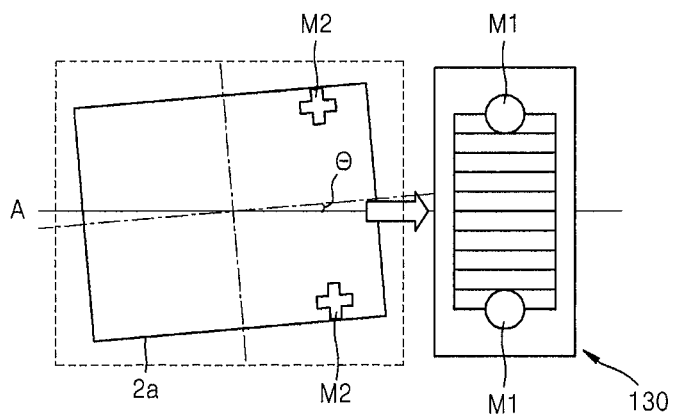
FIGS. 6 and 7 are schematic views illustrating an operation of aligning a master substrate and a patterning slit sheet according to an embodiment of the present invention.
Figure 7:
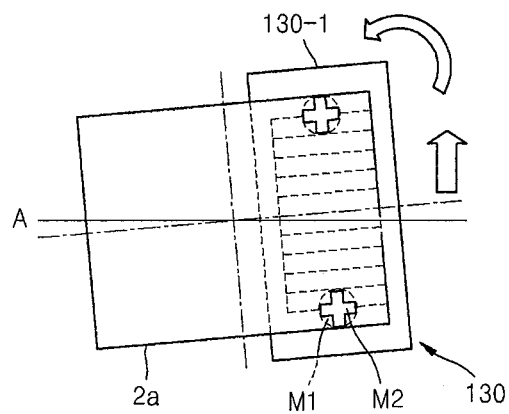

FIGS. 6 and 7 are schematic views illustrating an operation of aligning a master substrate 2a and a patterning slit sheet 130 according to an embodiment of the present invention.

The master substrate 2a is loaded before a layer forming substrate 2b is loaded and input into the deposition unit 100, and position information of the master substrate 2a is measured by using the measuring unit 10. When the master substrate 2a is chucked to the electrostatic chuck 432 by using the loading unit 200, the master substrate 2a may be distorted by θ° in an anti-clockwise direction with respect to a convey direction (e.g., a transport direction) A of the electrostatic chuck 432. The measuring unit 10 measures a degree of distortion of the master substrate 2a before the master substrate 2a is input into the deposition unit 100, that is, before the master substrate 2a is conveyed onto (e.g., to a position above) the patterning slit sheet 130.

Next, as illustrated in FIG. 7, the patterning slit sheet 130 is transported counter-clockwise by the degree (θ) of distortion (as shown in FIG. 6) of the master substrate 2a measured by using the measuring unit 10 to be aligned with the master substrate 2a. The alignment between the master substrate 2a and the patterning slit sheet 130 may be determined by checking whether the second alignment mark M2 formed on the master substrate 2a and the first alignment mark M1 formed on the patterning slit sheet 130 correspond to (e.g., are aligned to) each other. The second alignment mark M2 formed on the master substrate 2a and the first alignment mark M1 formed on the patterning slit sheet 130 may be observed by using the camera (e.g., cameras) 170 of FIG. 4.

Figure 8:
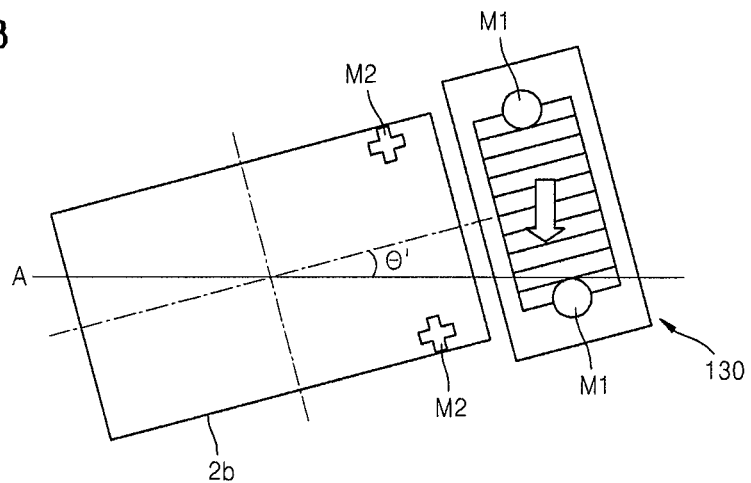
FIGS. 8, 9 and 10 are schematic views illustrating an operation of aligning a layer forming substrate and a patterning slit sheet according to an embodiment of the present invention.
Figure 9:
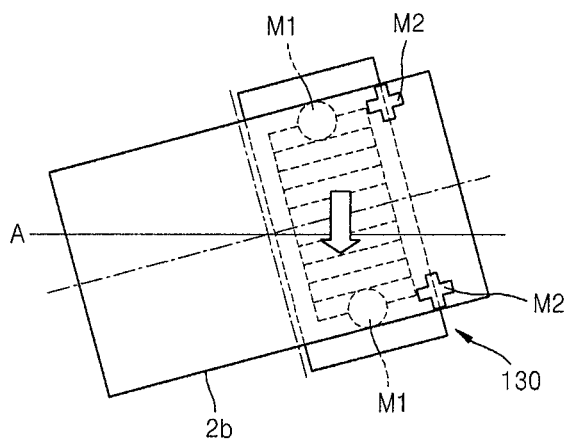
Figure 10:
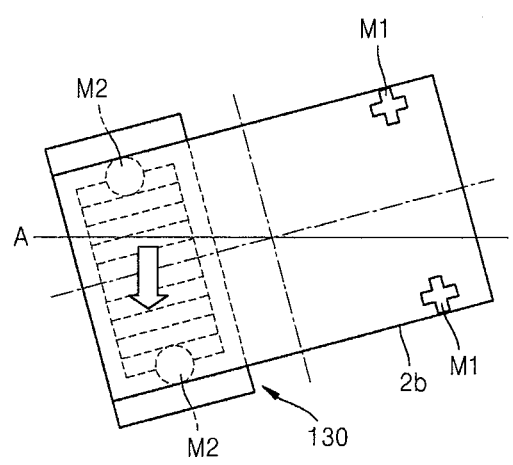

FIGS. 8, 9, and 10 are schematic views illustrating an operation of aligning the layer forming substrate 2b and the patterning slit sheet 130 according to an embodiment of the present invention.

After the master substrate 2a is input into the deposition unit 100, the layer forming substrate 2b is loaded, and position information of the layer forming substrate 2b may be measured by using the measuring unit 10 before the layer forming substrate 2b is input into the deposition unit 100.

As illustrated in FIG. 8, the layer forming substrate 2b may be chucked to the electrostatic chuck 432 by θ' in a counter-clockwise direction with respect to the convey direction (e.g., transport direction) A of the electrostatic chuck 432. The measuring unit 10 may measure a degree of distortion of the layer forming substrate 2b. Before the layer forming substrate 2b is input, the measuring unit 10 compares the degree of distortion (θ) of the master substrate 2a and the degree of distortion (θ') of the layer forming substrate 2b and calculates a difference therebetween.

The patterning slit sheet 130 is moved in a counter-clockwise direction (or clockwise direction) by the difference (θ'-θ) between the layer forming substrate 2b and the master substrate 2a so as to align the layer forming substrate 2b and the patterning slit sheet 130. The alignment may be further conducted when the layer forming substrate 2b moves along above the patterning slit sheet 130, as illustrated in FIGS. 9 and 10.

The alignment between the layer forming substrate 2b and the patterning slit sheet 130 may be determined by checking whether or not the second alignment mark M2 formed on the layer forming substrate 2b and the first alignment mark M1 formed on the patterning slit sheet 130 correspond to (e.g., are aligned with) each other. The second alignment mark M2 formed on the layer forming substrate 2b and the first alignment mark M1 formed on the patterning slit sheet 130 may be observed by using the camera (or cameras) 170 of FIG. 4.

Figure 11:
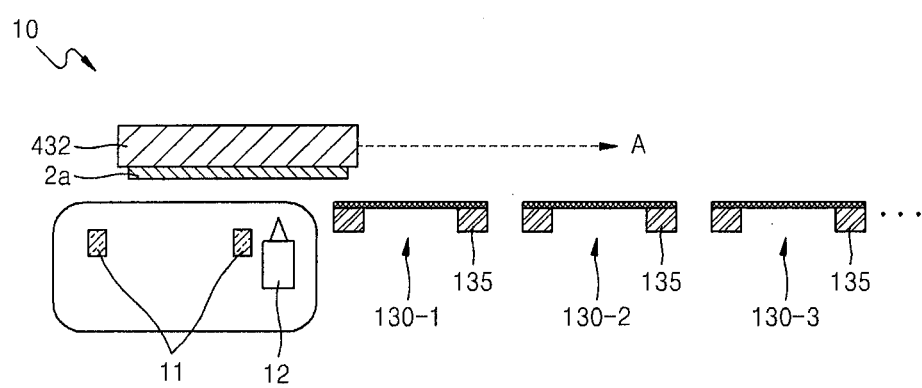
FIG. 11 is a schematic view illustrating an operation of measuring a distance from a measuring unit to a master substrate according to an embodiment of the present invention.

FIG. 11 is a schematic view illustrating an operation of measuring a distance from the measuring unit 10 to the master substrate 2a according to an embodiment of the present invention.

The master substrate 2a is loaded to the transfer unit 430 before the layer forming substrate 2b is loaded and input into the deposition unit 100, and as described above, a degree of distortion of the master substrate 2a is measured by using the measuring unit 10, and a distance between the measuring unit 10 and the master substrate 2a is measured.

Next, while the master substrate 2a moves along above the patterning slit sheets 130-1 through 130-n, an interval between each of the patterning slit sheets 130-1 through 130-n and the master substrate 2a is measured.

Figure 12:
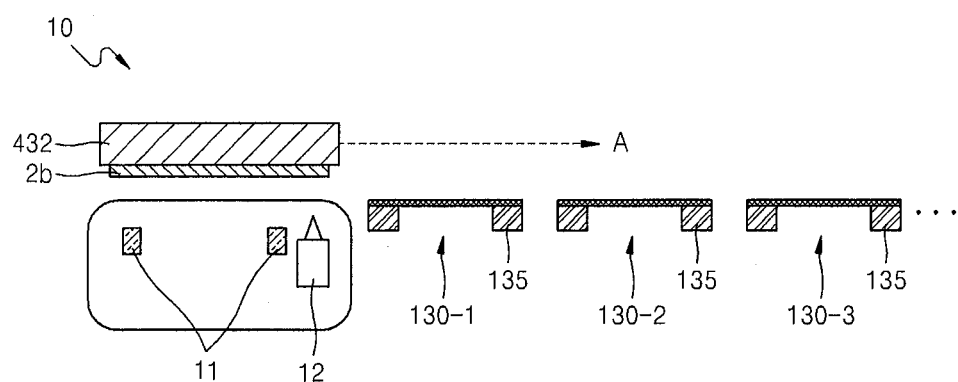
FIG. 12 is a schematic view illustrating an operation of measuring a distance from a measuring unit to a layer forming substrate according to an embodiment of the present invention.

FIG. 12 is a schematic view illustrating an operation of measuring a distance from the measuring unit 10 to the layer forming substrate 2b according to an embodiment of the present invention.

After the master substrate 2a is input into the deposition unit 100, the layer forming substrate 2b is loaded, and as described above, a degree of distortion of the layer forming substrate 2b is measured by using the measuring unit 10 before the layer forming substrate 2b is input into the deposition unit 100, and also, a distance of the measuring unit 10 to the layer forming substrate 2b is measured as illustrated in FIG. 12.

The measuring unit 10 compares a distance of the measuring unit 10 to the master substrate 2a and a distance of the measuring unit 10 to the layer forming substrate 2b and calculates a difference in the distances.

The patterning slit sheets 130-1 through 130-n are aligned such that intervals between the patterning slit sheets 130-1 through 130-n and the layer forming substrate 2b are uniformly maintained (or substantially uniformly maintained) based on the difference in the distances with respect to the master substrate 2a and the layer forming substrate 2b.

The alignment between the layer forming substrate 2b and the patterning slit sheet 130 will be described in detail with reference to FIGS. 13, 14, 15, and 16 below.

FIGS. 13 through 16 are schematic views illustrating an operation of aligning an interval between the layer forming substrate 2b and the patterning slit sheet 130 according to an embodiment of the present invention.

Figure 13:
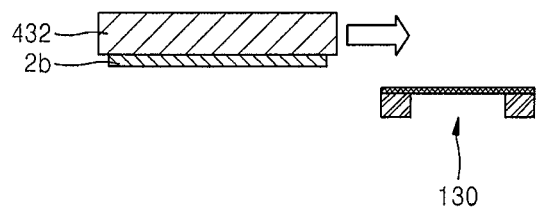
FIGS. 13, 14, 15 and 16 are schematic views illustrating an operation of aligning an interval between a layer forming substrate and a patterning slit sheet according to an embodiment of the present invention.

As illustrated in FIG. 13, before the layer forming substrate 2b is conveyed onto the patterning slit sheet 130, a difference in the distance of the measuring unit 10 to the master substrate 2a and the distance of the measuring unit 10 to the layer forming substrate 2b is calculated, and a movement amount for the patterning slit sheet 130 is determined based on the difference.

Figure 14:
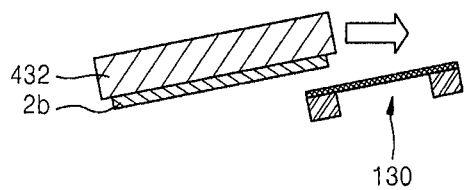
Figure 15:
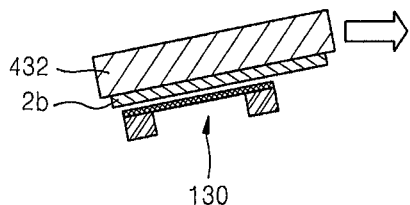
Figure 16:
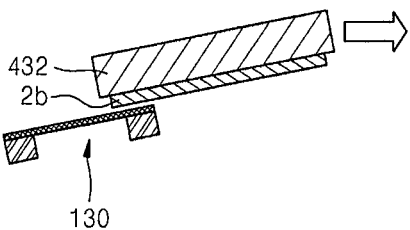

As illustrated in FIG. 14, when the layer forming substrate 2b enters (e.g., enters the space above) the patterning slit sheet 130, the patterning slit sheet 130 is transported according to the above movement amount so that an interval between the layer forming substrate 2b and the patterning slit sheet 130 is uniformly (or substantially uniformly) maintained.

Next, while the layer forming substrate 2b moves along above the patterning slit sheet 130, the patterning slit sheet 130 may also be moved such that an interval between the layer forming substrate 2b and the patterning slit sheet 130 is uniformly (or substantially uniformly) maintained.

Figure 17:
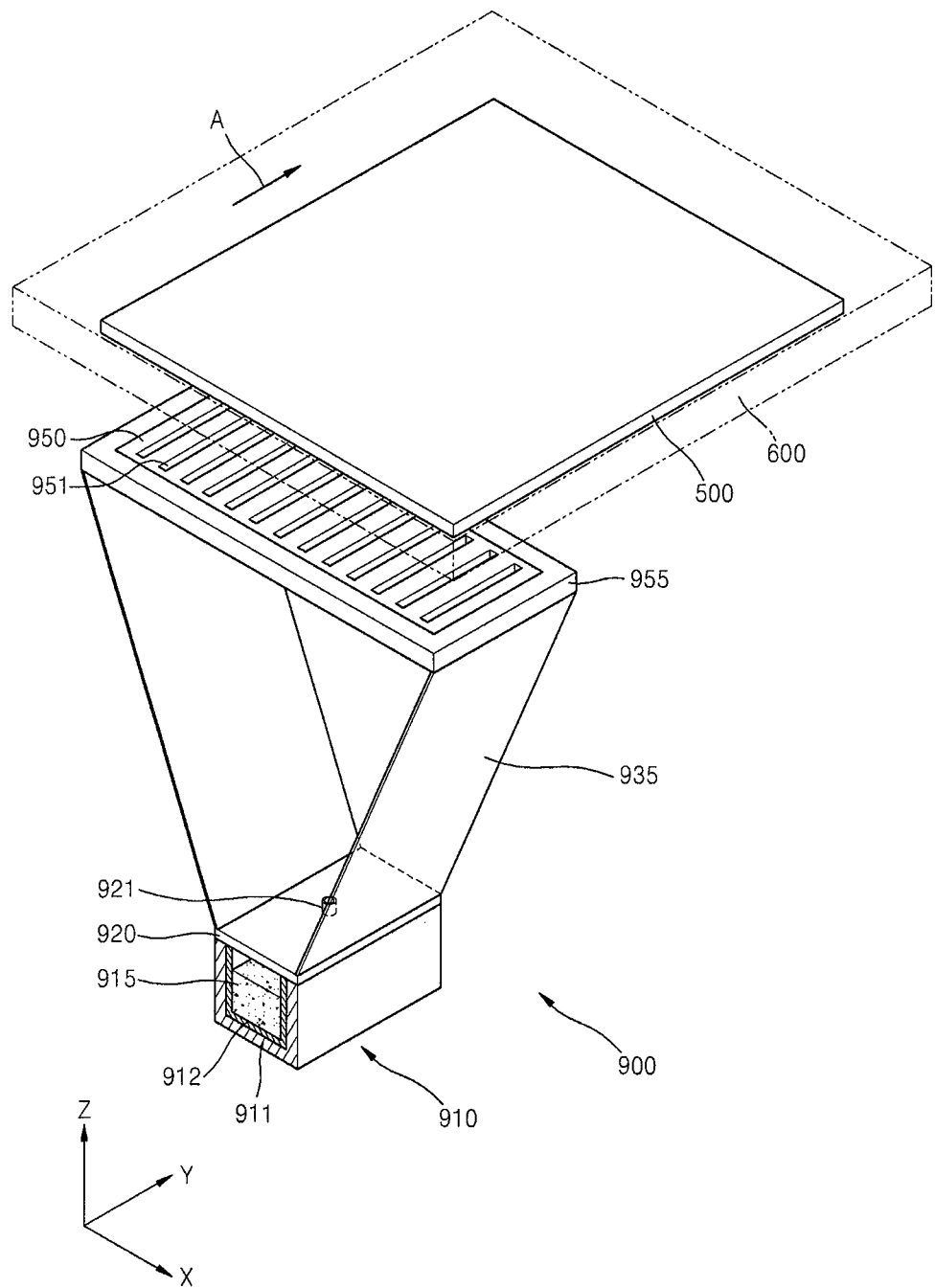
FIG. 17 illustrates an organic layer deposition assembly according to another embodiment of the present invention.

FIG. 17 is a schematic perspective view illustrating an organic layer deposition assembly 900 according to another embodiment of the present invention.

Referring to FIG. 17, the organic layer deposition assembly 900 includes a deposition source 910, a deposition source nozzle unit 920, and a patterning slit sheet 950.

The deposition source 910 includes a crucible 911 that is filled with a deposition material 915 and a heater 912 that heats the crucible 911 so as to vaporize the deposition material 915 filled in the crucible 911 toward a side of the deposition nozzle unit 920. The deposition source nozzle unit 920 may be located at a side of the deposition source 910, and one or more deposition source nozzles 921 are included in the deposition source nozzle unit 920 along a Y-axis direction. While only one deposition source nozzle 921 is illustrated in FIG. 17, the present invention is not limited thereto. The patterning slit sheet 950 and a frame 955 are further included between the deposition source 910 and a substrate 2, and a plurality of patterning slits 951 are formed in the patterning slit sheet 950 along an X-axis direction. Also, the deposition source 910 and the deposition source nozzle unit 920 and the patterning slit sheet 950 are coupled to each other by using a connecting member 935.

The arrangement of the plurality of deposition source nozzles 921 included in the deposition source nozzle unit 920 is different from that of the above-described embodiments, and thus will be described in detail below.

The deposition source nozzle unit 920 is located at a side of the deposition source 910, that is, at a side of the deposition source 910 facing the substrate 2. Also, a deposition source nozzle 921 is formed in the deposition source nozzle unit 920. The deposition material 915 that is vaporized in the deposition source 910 passes through the deposition source nozzle unit 920 to proceed to the substrate 2, which is to be deposited. If a plurality of deposition source nozzles are included along the X-axis direction, distances between the respective deposition source nozzles 921 and the patterning slit 951 may vary, and a shadow may be generated by a deposition material discharged from one of the deposition source nozzles, which is relatively far from the patterning slit 951. Thus, as in the current embodiment of the present invention, only one deposition nozzle 921 is formed in the X-axis direction so as to reduce (e.g., significantly reduce) generation of the shadow.

Figure 18:
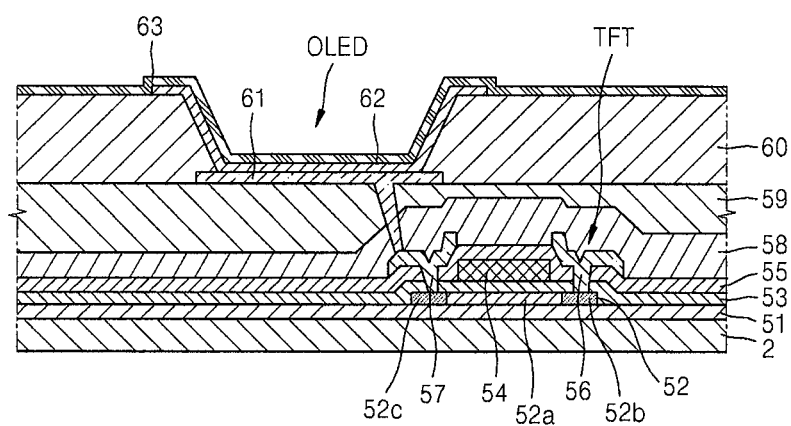
FIG. 18 is a cross-sectional view of an active matrix (AM)-type organic light-emitting display device manufactured using the organic layer deposition apparatus, according to an embodiment of the present invention.

FIG. 18 is a cross-sectional view of an active matrix (AM)-type organic light-emitting display device manufactured using the organic layer deposition apparatus 1, according to an embodiment of the present invention.

Referring to FIG. 18, the active matrix (AM)-type organic light-emitting display device according to the current embodiment is formed on a substrate 2. The substrate 2 may be formed of a transparent material, for example, glass, plastic, or metal. An insulating layer 51, such as a buffer layer, is formed on the entire surface of the substrate 2.

A thin film transistor TFT and an organic light-emitting diode OLED are disposed on the insulating layer 51, as illustrated in FIG. 18.

A semiconductor active layer 52 is formed on a top surface of the insulating layer 51 in a set or predetermined pattern. A gate insulating layer 53 is formed to cover the semiconductor active layer 52. The semiconductor active layer 52 may include a p-type or n-type semiconductor material.

A gate electrode 54 of the TFT is formed on a region of the gate insulating layer 53 corresponding to a channel region 52a of the semiconductor active layer 52. An interlayer insulating layer 55 is formed to cover the gate electrode 54. The interlayer insulating layer 55 and the gate insulating layer 53 are etched by, for example, dry etching, to form contact holes exposing parts of the semiconductor active layer 52.

Source/drain electrodes 56 and 57 are formed on the interlayer insulating layer 55 to contact source/drain regions 52b and 52c, respectively, of the semiconductor active layer 52 through the respective contact holes. A passivation layer 58 is formed to cover the source/drain electrodes 56 and 57, and is etched to expose a part of one of the source/drain electrodes 56 and 57. An insulating layer 59 may be further formed on the passivation layer 58 so as to planarize the passivation layer 58.

In addition, the organic light-emitting diode OLED displays set or predetermined image information by emitting red, green, or blue light according to current. The OLED includes a first electrode 61 located on the passivation layer 58 (and the insulating layer 59 when it is formed). The first electrode 61 is electrically connected to the exposed source/drain electrode 57 of the TFT.

A pixel-defining layer 60 is formed to cover the first electrode 61. An opening is formed in the pixel-defining layer 60, and an organic layer 62 including an emission layer (EML) is formed in a region defined by the opening. A second electrode 63 is formed on the organic layer 62.

The pixel-defining layer 60, which defines individual pixels, may be formed of an organic material. The pixel-defining layer 60 also planarizes the surface of a region of the substrate 2 in which the first electrode 61 is formed, and in particular, the surface of the insulating layer 59.

The first electrode 61 and the second electrode 63 are insulated from each other, and respectively apply voltages of opposite polarities to the organic layer 62 to induce light emission.

The organic layer 62, including an EML, may be formed of a low-molecular weight organic material or a high-molecular weight organic material. When a low-molecular weight organic material is used, the organic layer 62 may have a single or multi-layer structure including a hole injection layer (HIL), a hole transport layer (HTL), the EML, an electron transport layer (ETL), and/or an electron injection layer (EIL). Non-limiting examples of available organic materials may include copper phthalocyanine (CuPc), N,N'-di(naphthalene-1-yl)-N,N'-diphenyl-benzidine (NPB), and tris-8-hydroxyquinoline aluminum ($Alq_3$).

The organic layer 62 including an EML may be formed using the organic layer deposition apparatus 1 illustrated in FIG. 1. That is, an organic layer deposition apparatus including a deposition source that discharges a deposition material, a deposition source nozzle unit that is located at a side of the deposition source and includes a plurality of deposition source nozzles formed therein, and a patterning slit sheet that faces the deposition source nozzle unit and includes a plurality of patterning slits formed therein is located spaced apart by a set or predetermined distance from a substrate on which the deposition material is to be deposited. In addition, the deposition material discharged from the organic layer deposition apparatus 1 (refer to FIG. 1) is deposited on the substrate 2 (refer to FIG. 1) while the organic layer deposition apparatus 1 and the substrate 2 are moved relative to each other.

After the organic EML (i.e., organic emission layer) is formed, the second electrode 63 may be formed by the same deposition method as used to form the organic layer 62.

The first electrode 61 may function as an anode, and the second electrode 63 may function as a cathode. Alternatively, the first electrode 61 may function as a cathode, and the second electrode 63 may function as an anode. The first electrode 61 may be patterned to correspond to individual pixel regions, and the second electrode 63 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 63 may also be formed as a transparent electrode or a reflective electrode. In one embodiment, when the second electrode 63 is formed as a transparent electrode, the second electrode 63 may be used as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62 and forming an auxiliary electrode layer or a bus electrode line thereon from ITO, IZO, ZnO, $In_2O_3$, or the like. When the second electrode 63 is formed as a reflective electrode, the reflective layer may be formed by depositing Li, Ca, LiF/Ca, LiF/Al, Al, Ag, Mg, or a compound thereof on the entire surface of the organic layer 62. The second electrode 63 may be formed using the same deposition method as used to form the organic layer 62 described above.

The organic layer deposition apparatuses according to the embodiments of the present invention described above may be applied to form an organic layer or an inorganic layer of an organic TFT, and to form layers from various materials.

As described above, the one or more embodiments of the present invention provide organic layer deposition apparatuses that are suitable for use in the mass production of large substrates and enable high-definition patterning and methods of manufacturing an organic light-emitting display device by using the organic layer deposition apparatus.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light-emitting display device by using an organic layer deposition apparatus for forming an organic layer on a substrate, the method comprising:
   fixing the substrate to a transfer unit by using a loading unit;
   transporting, into a chamber, the transfer unit onto which the substrate is fixed, by using a first conveyer unit passing through the chamber;
   measuring position information of the substrate before the organic layer is formed on the substrate;
   forming the organic layer by depositing a deposition material discharged from an organic layer deposition assembly, onto the substrate while the substrate is moved relative to the organic layer deposition assembly, wherein the organic layer deposition assembly in the chamber is spaced apart from the substrate;
   separating the substrate, onto which the forming of the organic layer has been completed, from the transfer unit by using an unloading unit; and
   transporting the transfer unit, from which the substrate has been separated, to the loading unit by using a second conveyer unit passing through the chamber.

2. The method of claim 1, wherein the position information comprises a degree of distortion of the substrate with respect to a first direction and a distance of a measuring unit to the substrate.

3. The method of claim 1, wherein the substrate comprises a layer forming substrate and a master substrate,
   wherein the master substrate is input into the chamber before the layer forming substrate is input into the chamber.

4. The method of claim 3, wherein in the measuring of the position information, position information of the layer forming substrate is measured after position information of the master substrate is measured, and the layer forming substrate is fixed to the transfer unit and transferred to the chamber.

5. The method of claim 4, wherein the forming the organic layer comprises:
   aligning the organic layer deposition assembly and the layer forming substrate by comparing the position information of the master substrate and the position information of the layer forming substrate; and
   forming an organic layer by depositing a deposition material discharged from the organic layer deposition assembly, onto the substrate while the organic layer deposition assembly is moved relative to the layer forming substrate based on alignment information about alignment between the organic layer deposition assembly and the layer forming substrate.

6. The method of claim 5, wherein the aligning comprises:
   comparing the degree of distortion of the master substrate with respect to the first direction and the degree of distortion of the layer forming substrate with respect to the first direction to calculate a difference in distortion of the layer forming substrate with respect to the master substrate, and calculating a distance of a measuring unit to the master substrate and a distance of the measuring unit to the layer forming substrate; and
   aligning the organic layer deposition assembly and the layer forming substrate according to the change of distortion of the layer forming substrate, and controlling a height of a deposition unit so as to maintain a substantially uniform interval between the layer forming substrate and the deposition unit according to a difference in the distance of the measuring unit to the master substrate and the distance of the measuring unit to the layer forming substrate.

7. The method of claim 1, wherein the organic layer deposition assembly comprises:
   a deposition source for discharging a deposition material;
   a deposition source nozzle unit located at a side of the deposition source and comprising a plurality of deposition source nozzles; and
   a patterning slit sheet facing the deposition source nozzle unit and comprising a plurality of patterning slits,
   wherein the deposition material discharged from the deposition source passes through the patterning slit sheet to be deposited onto the substrate in a pattern.

8. The method of claim 7, wherein the patterning slit sheet of the organic layer deposition assembly has a smaller size than the substrate in at least one of a first direction or a second direction.

* * * * *